(12) United States Patent
Vulliet

(10) Patent No.: US 10,629,929 B2
(45) Date of Patent: Apr. 21, 2020

(54) TEST CELL OF AN APPARATUS FOR CHARACTERISING A CELL OF A FUEL CELL AND METHOD FOR PRODUCING SUCH A TEST CELL

(71) Applicant: COMMISSARIAT A L'ENERGIE ATOMIQUE ET AUX ENERGIES ALTERNATIVES, Paris (FR)

(72) Inventor: Julien Vulliet, Joue-les-Tours (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 170 days.

(21) Appl. No.: 15/557,919

(22) PCT Filed: Mar. 16, 2016

(86) PCT No.: PCT/EP2016/055708
§ 371 (c)(1),
(2) Date: Sep. 13, 2017

(87) PCT Pub. No.: WO2016/146696
PCT Pub. Date: Sep. 22, 2016

(65) Prior Publication Data
US 2018/0048005 A1     Feb. 15, 2018

(30) Foreign Application Priority Data

Mar. 18, 2015 (FR) ...................................... 15 52225

(51) Int. Cl.
*H01M 8/04298* (2016.01)
*G01R 31/36* (2020.01)
(Continued)

(52) U.S. Cl.
CPC ...... *H01M 8/04305* (2013.01); *G01R 31/389* (2019.01); *H01M 8/04298* (2013.01); *H01M 8/04656* (2013.01)

(58) Field of Classification Search
CPC ......... H01M 8/04305; H01M 8/04298; H01M 8/04656; G01R 31/44; G01R 31/3662
See application file for complete search history.

(56) References Cited

U.S. PATENT DOCUMENTS

| 6,214,487 | B1 * | 4/2001 | Kelley | .................... | H01M 8/02 |
| | | | | | 429/430 |
| 6,519,539 | B1 * | 2/2003 | Freeman | ................ | G01R 27/02 |
| | | | | | 702/65 |

(Continued)

OTHER PUBLICATIONS

U.S. Appl. No. 15/535,241, filed Jun. 12, 2017, Julien Vulliet.

(Continued)

*Primary Examiner* — Christopher P McAndrew
*Assistant Examiner* — Zannatul Ferdous
(74) *Attorney, Agent, or Firm* — Oblon, McClelland, Maier & Neustadt, L.L.P.

(57) ABSTRACT

A test cell configured to qualify an apparatus for characterizing cells of at least one fuel cell and a method for producing such a test cell. The test cell includes a first and a second contact face respectively including a first and a second contact area entirely or partially occupying a surface of the corresponding contact face, the first and second contact faces together delimiting an interior volume. The test cell further includes an equivalent passive circuit configured to have an equivalent impedance to at least one cell of a fuel cell, the equivalent circuit including a first and a second output terminal respectively connected to the first and second contact areas, the equivalent circuit being housed in the interior volume.

13 Claims, 2 Drawing Sheets

(51) Int. Cl.
  *H01M 8/04537* (2016.01)
  *G01R 31/389* (2019.01)

(56) References Cited

U.S. PATENT DOCUMENTS

| | | | | |
|---|---|---|---|---|
| 6,620,538 | B2* | 9/2003 | Bai | H01M 8/04559 |
| | | | | 429/431 |
| 8,125,193 | B2 | 2/2012 | Page et al. | |
| 2003/0030966 | A1* | 2/2003 | O'Bryan, Jr. | H01G 4/18 |
| | | | | 361/311 |
| 2008/0238430 | A1* | 10/2008 | Page | G01R 27/2605 |
| | | | | 324/425 |
| 2010/0264553 | A1* | 10/2010 | Wainerdi | H01L 24/29 |
| | | | | 257/783 |
| 2011/0059150 | A1* | 3/2011 | Kendall | A61K 9/0021 |
| | | | | 424/423 |
| 2012/0015222 | A1* | 1/2012 | Kosugi | B60L 3/0046 |
| | | | | 429/93 |
| 2015/0037966 | A1* | 2/2015 | Goasduff | H01L 21/3086 |
| | | | | 438/514 |

OTHER PUBLICATIONS

International Search Report dated May 20, 2016 in PCT/EP2016/055708 filed Mar. 16, 2016.

French Search Report dated Jul. 9, 2015 in FR 1552225 filed Mar. 18, 2015.

"Universal Dummy Cell 4-Operator's Manual," retrieved from: http://www.gamry.com/assets/Support-Downloads/Product-Manuals/UDC4-UniversalDummyCell4OperatorsManual.pdf, Feb. 2011, XP055193529, 6 pages.

"SI1287 Electrochemical Interface User Guide," retrieved from: http://www.chemistry.hku.hk/staff/kyc/equipment/1287_manual.pdf, Jun. 1999, XP055193728, 4 pages.

"Impedance Spectroscopy Theory, Experiment, and Applications," retrieved from: http://cdn.preterhuman.net/texts/science_and_technology/physics/spectroscopy/Impedance%20Spectroscopy,%20Theory%20Experiment%20and%20Applications%20-%20Macdonald.pdf, Jan. 2005, XP055193701, 4 pages.

Choi, Woojin et al., "Development of an Equivalent Circuit Model of a Fuel Cell to Evaluate the Effects of Inverter Ripple Current," 2004 IEEE Applied Power Electronics Conference and Exposition, APEC 04, IEEE, vol. 1, Feb. 2004, XP010704081, pp. 355-361.

Reggiani, U. et al., "Modelling a PEM fuel cell stack with a nonlinear equivalent circuit," Journal of Power Sources, vol. 165, No. 1, Jan. 2007, XP005883220, pp. 224-231.

Runtz, K.J. et al., "Fuel Cell Equivalent Circuit Models for Passive Mode Testing and Dynamic Mode Design," Electrical and Computer Engineering, 2005, Canadian Conference on Saskatoon, iEEE, May 2005, XP 010868926, pp. 794-797.

Cooper, K.R. et al., "Electrical test methods for on-line fuel cell ohmic resistance measurement," Journal of Power Sources, vol. 160, 2006, pp. 1088-1095.

* cited by examiner

TEST CELL OF AN APPARATUS FOR CHARACTERISING A CELL OF A FUEL CELL AND METHOD FOR PRODUCING SUCH A TEST CELL

TECHNICAL FIELD

The invention relates to the field of fuel cells and elements making up such cells and more particularly relates to qualification and/or calibration of apparatuses enabling these fuel cells and their elements to be characterised.

STATE OF PRIOR ART

Research works currently conducted on renewable energies and alternative energies to fossil fuels have highlighted fuel cells and particularly hydrogen cells. These fuel cells are actually one of the only viable alternative to fossil energies for transport over long distances for which the batteries show their limits.

The development of these fuel cells involves specific characterising apparatuses, such as frequency analysers, potentiostats and galvanostats. These apparatuses, and their connecting systems, have to be adapted to the features of the fuel cells and the elements making them up. Indeed, the feature of fuel cell elements, and the cells including them, is to exhibit a variable impedance and strongly dependant on the measured conditions. Thus, the pass band of the connectics used and the existence of possible cross-couplings are thereby especially critical. In particular, because of the operating temperatures of some fuel cells, the cables used cannot be shielded and thus platinum wires are used to connect the element or cell to be characterised with the characterising apparatuses. Such an absence of shielding obviously makes these apparatuses prone to significant cross-coupling issues.

For these reasons, and to ensure the accuracy of future characterisations, upon installing, and throughout their operation, these apparatuses have to be qualified and calibrated either, according to a first possibility, with test cases such as test module 12861 provided by Solartron, or, according to a second possibility, with so-called "sacrificial" elements.

Regarding the first possibility, the test cases do no enable the characterising apparatuses and in particular their connecting systems to be "really" qualified. Indeed, the operating conditions of such cases are very far from real conditions for characterising an element and/or a fuel cell. The case is indeed directly connected to the characterising apparatus by means of conventional connectors, such as coaxial cable systems. Thus, even leaving out the fact that these cases are not generally suitable for being really representative of an element and/or a fuel cell, they do not enable connection issues of the elements and/or fuel cells to be taken into account. Calibration with such cases is thus made without taking into account the cables used to make the junction between the element or cell to be characterised and the characterising apparatuses and the contact between these cables and the element or fuel cell. But, these cables and the contact between them and the element or cell can generate measurement artefacts or drifts in the measurement time that need to be corrected.

The second possibility, while it allows a characterisation as close as possible to the real operating conditions of the apparatus to be calibrated, is of course more expensive to implement. This second possibility further involves temperature conditions which make the qualification of the characterising apparatuses particularly complicated. Thereby, this solution is not the most suitable one either.

DISCLOSURE OF THE INVENTION

The invention aims at solving at least partially the above-mentioned drawbacks and thus one object thereof is to provide a device enabling an apparatus for characterising elements and/or fuel cells to be qualified and/or calibrated by taking into account connection issues of the elements and/or fuel cells, without having to use a sacrificial element or fuel cell.

To that end, the invention relates to a test element for qualifying an apparatus for electrically characterising elements of fuel cells and/or fuel cells. Said test element includes:
  a first and a second contact face respectively including a first and a second metal layer occupying all or part of the area of the corresponding contact face and respectively forming a first and a second contact zone, the first and the second contact faces delimiting an internal volume between them,
  a passive equivalent circuit configured to exhibit an impedance equivalent to at least one fuel cell element, said equivalent circuit including a first and a second output terminal respectively connected to the first and the second contact zone, the equivalent circuit being housed in the internal volume.

Such an element allows contacting as close as possible to that of an element or a fuel cell. Indeed, such a test element can be connected by means of its two contact faces with a configuration similar to that of an element or a fuel cell.

Indeed, in a test bench of electrochemical elements of a fuel cell, the electrical connection between the fuel cell element(s) and electrical characterising apparatuses is made by metal grids (like platinum, gold, nickel, silver . . . ) or by metal solid interconnectors. To ensure a proper electrical contact, tightening the assembly is required.

Thus, by having metal layers representative of that of one or more fuel cell elements, the test element can be connected by using the same metal grids or same metal solid interconnectors while applying the same tightening force to the assembly. The connection of a test element according to the invention is thus representative of that which is obtained with a fuel cell element.

The connection between the test element and the apparatus can thus be made with the same cables and the same contact conditions that those which will be used with the elements and/or fuel cells. In this way, it is possible to qualify and/or calibrate an apparatus by taking into account the connection issues of the elements and fuel cells without having to use a sacrificial element or fuel cell.

Morever with an equivalent circuit adapted to occupy a contained volume, it is possible, by suitably defining the dimensions of the internal volume, to obtain a test element having the same dimensions as a fuel cell element. Under these conditions, the test element is perfectly adapted to equip a characterising bench and be easily substituted by an element to be characterised once the apparatus is suitably calibrated.

By "passive equivalent circuit", it is meant above and in the rest of this document, that the circuit has an impedance equivalent to a reference fuel cell element, that is between 90% and 110% of that of the same reference fuel cell element on at least one given frequency range, such as for example between 0.1 Hz and 100 MHz. Thus, it can be noted that such an equivalence can be, for example, checked by drawing a Nyquist plot on the given resistance range. Such passive equivalent circuits are known from prior art, in particular from Document U.S. Pat. No. 8,125,193 B2 and the article of Cooper K. R. and Smith M. published in the scientific journal "Journal of Power Sources" n° 160 pages 1088, 1095 in 2006.

By "internal volume limited by two faces", it is meant above and in the rest of this document, the internal volume of a closed envelope comprised of said two faces and a surface which, connecting said two faces, has a minimum area. It can be noted in the particular case which can be conventionally implemented within the scope of the invention where the first and the second faces are substantially identical and parallel to each other, the minimum area surface is the surface delimited by all the straight line segments with ends connecting the respective homologous points of the periphery of the first and the second face in twos.

The rest of the internal volume can be filled with a curable resin such as an epoxide resin, unsaturated polyester or epoxy acrylate.

Such a resin enables an element having both a proper mechanical strength, similar to that of fuel cell elements and fuel cells, and a proper electrical insulation for the passive equivalent circuit to be provided.

By "heat curable material", it is meant above and in the rest of this document, any material conventionally obtained by polymerization and cross-linking of monomers, oligomers and/or pre-polymers, in the presence of a cross-linking agent, also referred to as a "curing agent", in particular under the effect of a radiation (for curable compositions), heat (for heat curable compositions), or even pressure. At the end of this polymerization, which is moreover irreversible, a cured material is obtained, which has mechanical properties which are relatively stable and neutral from a chemical point of view.

The equivalent circuit can include at least the following components in series:
    a first inductance,
    a first resistance,
    one or more assemblies each comprised of a capacitance and of a resistance connected in parallel.

The inductance value can be between 0 and 10 mH, the value of each of the resistances can be between 0 and 1 Ohm and the value of each of the capacitances can be between 10 µF and 1 F.

Such an equivalent circuit makes it possible to easily obtain an impedance equivalent to that of a reference fuel cell element on a well-defined frequency range. Indeed, the choice of the number of assemblies and the values of the capacitances and inductances of the components of these assemblies enables the frequency range on which the equivalent circuit has the equivalent impedance to be accurately set.

The test element according to the invention can include components of the surface-mounted component type to form the equivalent circuit.

An equivalent circuit perfectly able to be contained within the reduced volume of a fuel cell can thus be obtained.

The first and the second contact zones can be formed by a metal layer the metal of which is selected from the group including gold and platinum.

Each of the contact zones can respectively occupy substantially the entire area of the corresponding contact face.

Such contact zones make it possible to achieve the apparatus contacting the test element similar to that of a fuel cell element. It is thus possible to perfectly take into account the contact conditions which will be used with the elements and/or fuel cells.

The equivalent circuit can be configured to have an impedance equivalent to several fuel cell elements connected in series and thus forming a test fuel cell.

The invention further relates to a method for manufacturing a test element intended qualify to an apparatus for characterising fuel cell elements and/or fuel cells, including the steps of:
    providing a passive equivalent circuit configured to exhibit an impedance equivalent to at least one fuel cell element, said equivalent circuit including a first and a second output terminal,
    providing a first and a second contact face each including a contact zone and arranging them such that they delimit an internal volume between them in which the equivalent circuit is housed with its first and second output terminals respectively connected to the first and second contact zones Such a manufacturing method enables a test element according to the invention to be provided and advantages related thereto to be achieved.

The step of providing the first and the second contact faces includes a substep of:
    encapsulating the equivalent circuit in a curable resin block such as an epoxide resin, unsaturated polyester or epoxy acrylate with the first and the second terminals of the equivalent circuit projecting from said resin block obtained after curing said resin on a first and a second face of said block.

The step of providing the first and the second contact faces further includes the additional substeps of:
    polishing the first and the second faces of the resin block from which the first and the second terminals of the equivalent circuit project,
    depositing the first and the second metal layers on the first and the second faces of the resin block to form the first and the second contact zones respectively.

Such substeps enable a test element according to the invention to be obtained having mechanical and/or contacting characteristics similar to those of a fuel cell element or a fuel cell thus ensuring a particularly suitable qualification of the characterising apparatus.

BRIEF DESCRIPTION OF THE DRAWINGS

The present invention will be better understood upon reading the description of exemplary embodiments, given by way of purely indicative and in no way limiting purposes, making reference to the appended drawings in which.

Identical, similar or equivalent parts of the different figures bear the same reference numerals so as to facilitate switching from one figure to the other.

The different parts represented in the figures are not necessarily drawn to a uniform scale, for making the figures more understandable.

The different possibilities (alternatives and embodiments) must be understood as being not exclusive to each other and can be combined with each other.

DETAILED DISCLOSURE OF PARTICULAR EMBODIMENTS

Figure 1A:
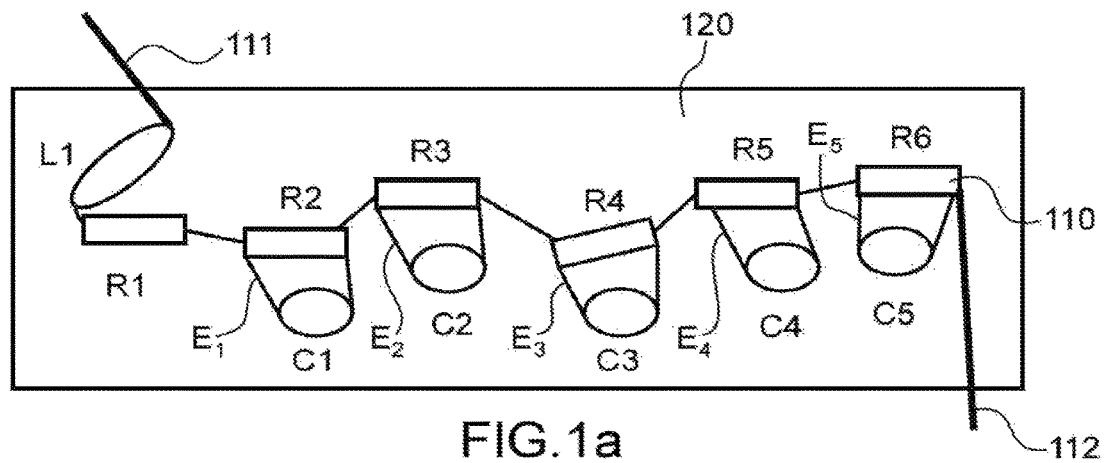
FIGS. 1a to 1c schematically illustrate the main manufacturing steps of a test element according to the invention, Fig. schematically illustrates the passive equivalent circuit of a fuel cell element usable in a test element according to the invention, FIGS. 3a and 3b each illustrate a Nyquist diagram obtained with an equivalent circuit according to the invention and with a fuel cell element respectively.
Figure 1B:
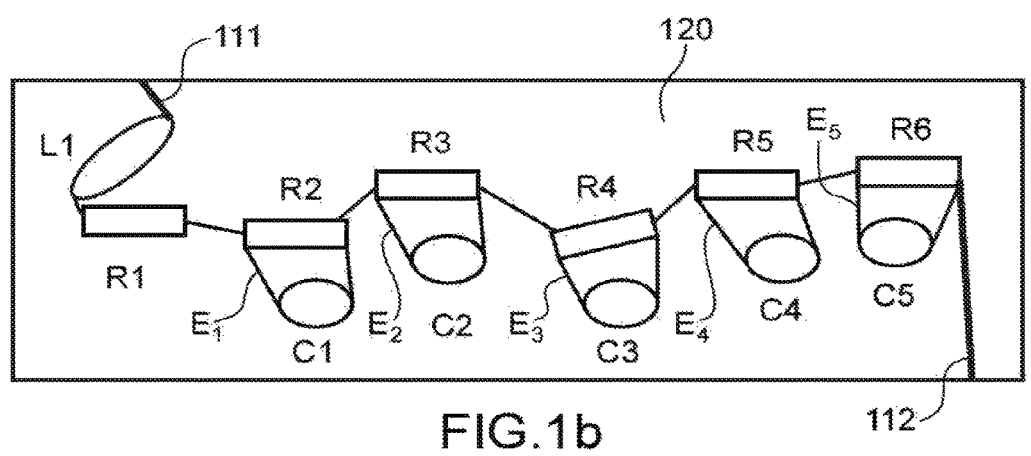
Figure 1C:
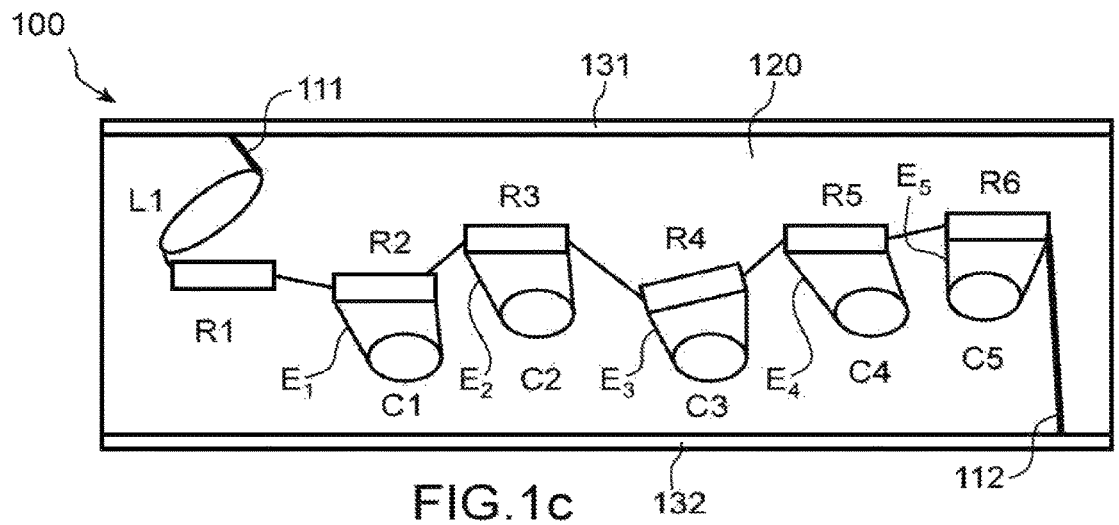

FIGS. 1a to 1c illustrate the main steps of manufacturing a test element 100 according to the invention. Such a test element 100, represented in FIG. 1c, is suitable for enabling an apparatus for characterising elements and/or fuel cells to be qualified and/or calibrated by being placed in place of the element or the fuel cell to be characterised.

Such a test element 100 includes:
- a first and a second contact face 131, 132 including respectively a first and a second metal contact zone 135, 136 occupying the entire area of the corresponding contact face 131, 132, the first and the second contact faces (131, 132) defining an internal volume between them,
- a passive equivalent circuit 110 configured to exhibit an impedance equivalent to that of a fuel cell element, said equivalent circuit 110 including a first and a second output terminal 111, 112 respectively connected to the first and the second contact zones 135, 136, the equivalent circuit being housed in the internal volume,
- a filling material 120, such as a curable resin, filling the rest of the internal volume left free by the equivalent circuit 110, the same thus marking the internal volume.

The test element 100 preferentially has general a shape in accordance with that of the fuel cell elements intended be to characterised by the characterising apparatuses to be qualified and/or calibrated. Thus, for example, the test element 100 can have a square parallelepiped shape with two square faces with a side between 1 and 25 cm and a height between both these faces between 0.5 and 5 cm. In such a configuration, each of the square faces forms one of the first and second contact faces 131, 132. Thus, the first and the second contact faces 131, 132 delimit the square parallelepiped volume between them and thus the internal volume of the test element 100.

Of course, the test element 100, as fuel cell elements, can have a another general shape, such as for example that of a revolving cylinder without departing from the scope of the invention. In the case where the test element 100 has a general revolving cylinder shape, the bases of the cylinder each form one the first and the second contact faces 131, 132. Such an element could have a first and a second face the diameter of which is between 1 and 20 cm for a height between 0.5 and 5 cm.

Another exemplary configuration worth considering is a rectangular parallelepiped shape having two rectangular faces with an area between 1 and 500 cm$^2$ separated from each other by a height between 0.5 and 5 cm. Both rectangular faces form the first and the second contact faces 131, 132 respectively and thus delimit the internal volume corresponding to said rectangular parallelepiped.

The first and the second contact faces 131, 132, in a conventional configuration of the invention, are two substantially identical planar surfaces which are parallel to each other and facing each other. The first and second contact zones 135, 136 occupy all or part of the area of the corresponding face 131, 132 respectively. In the conformation illustrated in FIG. 1c, each of the contact zones 135, 136 occupies the entire area of the corresponding contact face 131, 132.

The contact zone 135, 136 is formed by a metal layer deposited onto the filling material 120. Such a metal layer can be, for example, a gold or platinum layer deposited by sputtering or a conductive lacquer the filling material 120 with which has been coated. The contact zone 135, 136 covers the entire area of the corresponding contact face 131, 132. Of course, each contact zone 135, 136 can cover only the single area portion of the corresponding contact face 131, 132 without departing from the scope of the invention.

The filling material 120 enables rigidity of the test element 100 to be ensured. The filling material can be a heat curable resin such as an epoxide resin, unsaturated polyester, or epoxy acrylate.

Figure 2:
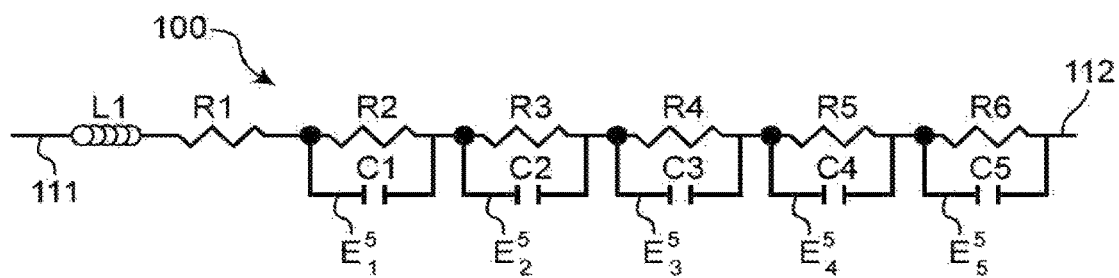

The passive equivalent circuit can include, as illustrated in FIG. 2, in series:
- an inductance L1,
- a first resistance R1,
- five assemblies E1, E2, E3, E4, E5 each comprised of a capacitance C1, C2, C3, C4, C5 and of a resistance R2, R3, R4, R5, R6 connected in parallel.

The inductance L1 is between 0 and 10 mH. The resistances R2, R3, R4, R5, R6 have resistance values between 0 and 1Ω. The capacitances have a capacitance value between 10 μF and 1 F.

Figure 3A:
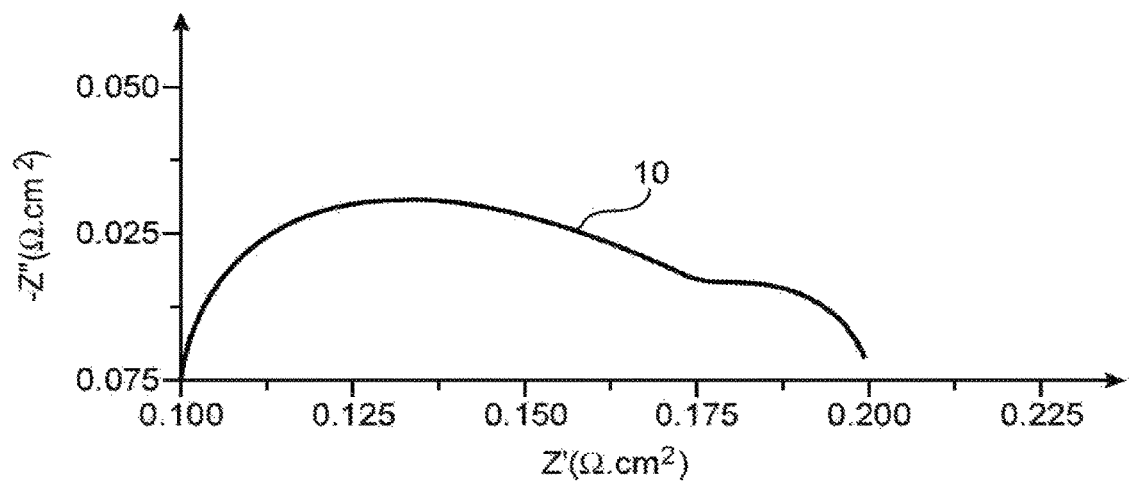

FIG. 3a illustrates an exemplary Nyquist diagram which can be obtained with such an equivalent circuit. For this example, the inductance has been set to 0.01 μH and the first resistance R1 to 0.1Ω. The values of the second resistance and of the third and fourth resistances have been respectively set to 0.05Ω and 0.25Ω, the resistances R5 and R6 being null. The capacitance values retained for the first, second and third capacitances C1, C2, C3 are respectively 3 mF, 30 mF and 0.3 mF. As for them the fourth and fifth capacitances C4, C5 are null.

Figure 3B:
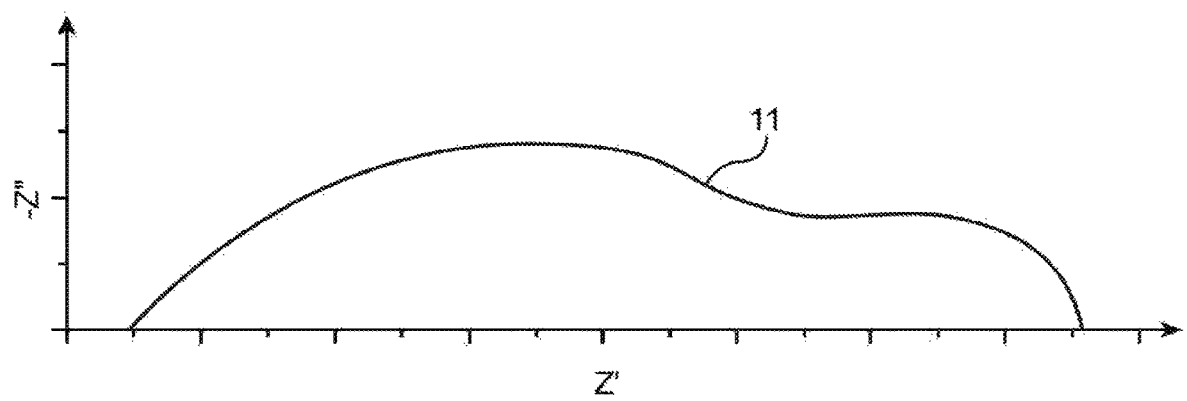

It can be seen that with such values, the Nyquist diagram is equivalent to that obtained with a conventional fuel cell element represented in FIG. 3b.

To allow an equivalent circuit 110 occupying a contained volume to be obtained and thus allow the invention to be considered in order to qualify and/or calibrate characterising apparatuses dedicated for small dimension elements, the components of the passive equivalent circuit can be surface-mounted type components, better known as SMC.

Such a test element 100 can be manufactured by a manufacturing method including the following steps of:
- providing the possible equivalent circuit 110 as the one depicted in FIG. 2,
- encapsulating, as illustrated in FIG. 1a, the passive equivalent circuit in a filling material, the encapsulating being made such that the filling material has, after encapsulation, the dimension of a fuel cell element and that the first and the second terminals 111, 112 of the passive equivalent circuit 110 project from the block of filling material formed during encapsulation each on one face of the latter,
- polishing, as illustrated in FIG. 1b, the faces of the block of the filling material from which the first and the second terminals project, so as to remove the projecting parts from said first and second terminals,
- forming, as illustrated in FIG. 1, on said faces of, a first and a second contact zones respectively contacting the first and the second terminals of the passive equivalent circuit, the first and the second faces 131, 132 of the element being thus formed.

If in the embodiment described above the test element includes a filling material, it is of course worth considering that the element does not include a filling material. According to this possibility, the first and the second contact faces 131, 132, and the corresponding contact zones 135, 136, can be formed by a first and a second metal plate rigidly linked to each other, for example by a reinforcement, and enclosing the passive equivalent circuit. The passive equivalent circuit 110, in order to ensure a long term installation in the internal volume, can be welded to an integrated circuit type support supported on the internal surface of one of the first and second metal plates.

Of course, if in the embodiment described above, the passive equivalent circuit includes an inductance, a resistance and several resistance/capacitance assemblies in series, it is also worth considering that the test element includes another equivalent circuit type, such as for example those mentioned in Document U.S. Pat. No. 8,125,193 B2, without departing from the scope of the invention.

The invention claimed is:

1. A test cell for qualifying an apparatus, the apparatus being an apparatus for electrically characterizing cells of at least one fuel cell, the test cell comprising:
    a first contact face and a second contact face, the first contact face including a first metal layer occupying all or part of an area of the first contact face and forming a first contact zone, the second contact face including a second metal layer occupying all or part of an area of the second contact face and forming a second contact zone, the first contact face and the second contact faces delimiting together an internal volume between them;
    a passive equivalent circuit configured to exhibit an impedance equivalent to at least one cell of a fuel cell element, the passive equivalent circuit including a first output terminal and a second output terminal, the first output terminal being connected to the first contact zone, the second output terminal being connected to the second contact zone, the passive equivalent circuit being housed in the internal volume.

2. The test cell according to claim 1, wherein a rest of the internal volume is filled with one of a curable resin, an epoxide resin, an unsaturated polyester, or an epoxy acrylate.

3. The test cell according to claim 1, wherein the passive equivalent circuit includes at least the following components in series:
    a first inductance,
    a first resistance,
    one or more assemblies, each assembly comprising a corresponding capacitance and a corresponding resistance, the corresponding capacitance and the corresponding resistance of each assembly being connected in parallel.

4. The test cell according to claim 3, wherein the inductance value of the first inductance is between 0 and 10 mH, the value of each of the first resistance and of the corresponding resistance of each assembly is between 0 and 1 Ohm and the value of the corresponding capacitance of each assembly is between 10 μF and 1 F.

5. The test cell according to claim 1, wherein the passive equivalent circuit includes components of surface-mounted component type.

6. The test cell according to claim 1, wherein, a metal of the first metal layer and/or of the second metal layer being selected from gold or platinum.

7. The test cell according to claim 1, wherein the first contact zone occupies an entire area of the first contact face, and
    wherein the second contact zone occupies an entire area of the second contact face.

8. The test cell according to claim 1, wherein the passive equivalent circuit is configured to exhibit an impedance equivalent to plural cells of a fuel cell connected in series and forming a test fuel cell.

9. A method for manufacturing a test cell for qualifying an apparatus, the apparatus being for characterizing cells of at least one fuel cell, the test cell comprising:
    providing a passive equivalent circuit configured to exhibit an impedance equivalent to at least one cell of a fuel cell, the passive equivalent circuit including a first and a second output terminal;
    providing a first contact face and a second contact face, the first contact face including a first metal layer occupying all or part of an area of the first contact face and forming a first contact zone, the second contact face including a second metal layer occupying all or part of an area of the second contact face and forming a second contact zone;
    arranging the first contact face and the second contact face to delimit an internal volume between them in which the passive equivalent circuit is housed with the first output terminal connected to the first contact zone and the second output terminal connected to the second contact zone.

10. The manufacturing method according to claim 9, wherein the providing the first contact face and the second contact faces includes:
    encapsulating the passive equivalent circuit in a curable resin block and curing the curable resin block to form a resin block, wherein the first output terminal is projecting from the resin block on a first face of the resin block, and wherein the second output terminal is projecting from the resin block on a second face of the resin block.

11. The manufacturing method according to claim 10, wherein a resin of the curable resin block is selected from an epoxide resin, an unsaturated polyester, or an epoxy acrylate.

12. The manufacturing method according to claim 10, wherein the providing the first contact face and the second contact face further includes:
    polishing the first face of the resin block and the second face of the resin block;
    depositing the first metal layer on the first face of the of the resin block and the second metal layer on the second face of the resin block to form the first contact zone and the second contact zone.

13. A test cell for qualifying an apparatus, the apparatus being an apparatus for electrically characterizing cells of at least one fuel cell, the test cell comprising:
    a first contact face and a second contact face, the first contact face including a first metal layer occupying all or part of an area of the first contact face and forming a first contact zone, the second contact face including a second metal layer occupying all or part of an area of the second contact face and forming a second contact zone, the first contact face and the second contact faces delimiting together an internal volume between them;
    a passive equivalent circuit configured to exhibit an impedance equivalent to at least one cell of a fuel cell element, the passive equivalent circuit including a first output terminal and a second output terminal, the first output terminal being connected to the first contact zone, the second output terminal being connected to the second contact zone, the passive equivalent circuit being housed in the internal volume, wherein the first contact zone occupies an entire area of the first contact face, and wherein the second contact zone occupies an entire area of the second contact face.

\* \* \* \* \*